United States Patent [19]
Dhong et al.

[11] Patent Number: 5,204,280
[45] Date of Patent: Apr. 20, 1993

[54] PROCESS FOR FABRICATING MULTIPLE PILLARS INSIDE A DRAM TRENCH FOR INCREASED CAPACITOR SURFACE

[75] Inventors: Sang H. Dhong, Mahopac; John C. Malinowski, Wappingers Falls, both of N.Y.

[73] Assignee: International Business Machines Corporation, Armonk, N.Y.

[21] Appl. No.: 865,505

[22] Filed: Apr. 9, 1992

[51] Int. Cl.$^5$ .................................... H01L 21/70
[52] U.S. Cl. .................................... 437/52; 437/47; 437/48; 437/60; 437/228; 437/229; 437/235; 437/919
[58] Field of Search ............ 437/47, 48, 52, 60, 437/228, 229, 233, 235, 919; 357/23.6; 148/DIG. 50; 156/643

[56] References Cited
U.S. PATENT DOCUMENTS 4,803,181 2/1989 Buchmann et al. ............ 437/229
5,047,117 9/1991 Roberts ............ 437/228

FOREIGN PATENT DOCUMENTS 201531 9/1991 Japan .

Primary Examiner—Tom Thomas
Attorney, Agent, or Firm—John J. Goodwin; Philip J. Feig

[57] ABSTRACT

A method is disclosed for fabricating a DRAM trench capacitor with multiple-pillars inside the trench for increased surface area.

A thin pad oxide of a few tens of nonometers is grown on a silicon substrate. A layer of silicon nitride is deposited and another layer of oxide is then deposited. This provides the ONO stack. Then a layer of polysilicon, a layer of nitride, and a layer of large-grained polysilicon are deposited sequentially. Then, a trench is defined by a lithographic mask and the exposed large-grained polysilicon is etched in $CF_4$. Since $CF_4$ etches the polysilicon and nitride 20 at almost the same rates, the topographical features existed in the polysilicon layer is copied to the nitride layer. The nitride layer is partially etched. The RIE etching gas is then changed to a mixture of HBR, $SiF_4$, Helium, and $NF_3$ which gives a very directional polysilicon etching with a good selectivity to nitride and a very high selectivity to oxide. Consequently, the topographical features on the nitride layer is enhanced and is transferred to the polysilicon layer which is used as a mask to etch the oxide nitride and pad oxide to form pillars.

6 Claims, 6 Drawing Sheets

BEFORE ETCHING

AFTER ETCHING

PROCESS FOR FABRICATING MULTIPLE PILLARS INSIDE A DRAM TRENCH FOR INCREASED CAPACITOR SURFACE

BACKGROUND OF THE INVENTION

1. Field of the Invention

The present invention relates to the fabrication of semiconductor memory devices of the type including trench memory storage capacitors, and more particularly, to a semiconductor memory device where the surface area of the trench memory storage capacitor is increased.

2. Background Art

U.S. Pat. No. 4,557,395, issued Mar. 25, 1986 to Shibata, entitled METHOD OF MANUFACTURING SEMICONDUCTOR MEMORY DEVICE HAVING TRENCH MEMORY CAPACITOR discloses a method of manufacturing a semiconductor memory device having a trench memory capacitor. First masks are formed on an element forming region of a semiconductor substrate formed of the element forming region and an element isolation region. A film formed of a different material from that of the first masks is deposited and it etched by anisotropic dry etching to leave second masks around the first mask. The semiconductor substrate is selectively etched using the first and second masks as an etching mask so as to form a first groove in the element isolation region. An insulation film is buried in the first groove. A portion of the first mask, formed at least above memory capacitor forming regions in the element forming region, is removed by etching, thereby forming a third mask on a portion excluding the, memory capacitor forming region. The semiconductor substrate is selectively etched by using the second and third masks and the insulation film buried in the first groove as an etching mask so as to form second grooves in the respective memory capacitor forming regions. A distance between the first and second grooves is defined by the second masks in a self-alignment manner. A capacitor electrode is formed in the second grooves through a gate insulation film.

U.S. Pat. No. 4,905,065, issued Feb. 27, 1990 to Selcuk et al. entitled HIGH DENSITY DRAM TRENCH CAPACITOR ISOLATION EMPLOYING DOUBLE EPITAXIAL LAYERS describes a new double-epitaxial structure for isolating deep trench capacitors with 1 $\mu$m or less spacing is disclosed. The structure comprises a thin, lightly doped upper epitaxial layer on top of a thicker and more heavily doped bottom epitaxial layer. The low resistivity bottom epitaxial layer is intended to isolate trench capacitors of any depth. The high resistivity upper epitaxial layer is used for the CMOS periphery and can be selectively doped to achieve a near uniform concentration to isolate trench capacitors in the core region surrounding the capacitors. Isolation between deep trenches at 1 $\mu$m spacing has been demonstrated to be applicable for 4 Megabit and greater DRAM integration levels.

U.S. Pat. No. 4,859,622, issued Aug. 22, 1989 to Eguchi, entitled METHOD OF MAKING A TRENCH CAPACITOR FOR DRAM discloses a structure wherein two or three trenches are formed in a silicon substrate facing the trenches. An oxide film for insulation is formed on a surface of the conductive layer facing the trenches. The trenches are filled with polysilicon, and the conductive layer and the polysilicon constitute a capacitor through the oxide film. Since this capacitor has two or three trenches, an effective area sufficiently large for increasing a capacitance value of the capacitor can be obtained without increasing the plane area of the device. The conductive layer and the polysilicon are connected to aluminum interconnection layers through a silicide layer, so as to be connected to other integrated circuits.

U.S. Pat. No. 4,737,470 issued Apr. 12, 1988 to Bean, entitled METHOD OF MAKING THREE DIMENSIONAL STRUCTURES OF ACTIVE AND PASSIVE SEMICONDUCTOR COMPONENTS relates to a three dimensional semiconductor structure formed in a semiconductor substrate wherein electrical components, both active and passive, are formed on the substrate surface as well as in grooves formed in the substrate at an angle and extending to the surface. The substrate surface is designed to lie in a predetermined crystallographic plane of the substrate material and the grooves extend in a predetermined crystallographic direction from said plane, this being accomplished by orientation dependent etching.

U.S. Pat. No. 4,650,544, issued Mar. 17, 1987 to Erb et al., entitled SHALLOW GROOVE CAPACITOR FABRICATION METHOD discloses a structure wherein a shallow capacitor cell is formed by using conventional integrated circuit processes to build a substrate mask having sublithographic dimensions. Multiple grooves, or trenches, are etched into the substrate using this mask. The capacitor dielectric layer and plate are then formed in the grooves.

U.S. Pat. No. 4,849,854, issued Jul. 18, 1987 to Eguchi, entitled SEMICONDUCTOR DEVICE AND METHOD OF MANUFACTURING THE SAME teaches a structure wherein two or three trenches are formed in a silicon substrate, and a conductive layer is formed in the silicon substrate facing the trenches. An oxide film for insulation is formed on a surface of the conductive layer facing the trenches. The trenches are filled with polysilicon, and the conductive layer and the polysilicon constitute a capacitor through the oxide film. Since this capacitor has two or three trenches, an effective area sufficiently large for increasing a capacitance value of the capacitor can be obtained without increasing the plane area of the device. The conductive layer and the polysilicon are connected to aluminum interconnection layers through a silicide layer, so as to be connected to other integrated circuits.

U.S. Pat. No. 4,920,065, issued Apr. 24, 1990 to Chin et al., entitled METHOD OF MAKING ULTRA DENSE DRAM CELLS relates generally to dynamic random access semiconductor memory arrays and more specifically relates to an ultra dense dynamic random access memory array. It also relates to a method of fabricating such arrays using a plurality of etch and refill steps which includes a differential etching step which is a key step in forming insulating conduits which themselves are adapted to hold a pair of field effect transistor gates of the adjacent transfer devices of one device memory cells. The differential etch step provides spaced apart device regions and an insulation region of reduced height between the trenches which space apart the memory cells. The resulting structure includes a plurality of rows of vertically arranged field effect transistors wherein the substrate effectively acts as a counterelectrode surrounding the insulated drain regions of each of the one device memory cells.

U.S. Pat. No. 5,013,680, issued May 7, 1991 to Lowrey et al., entitled PROCESS FOR FABRICATING A DRAM ARRAY HAVING FEATURE WIDTHS THAT TRANSCEND THE RESOLUTION LIMIT OF AVAILABLE PHOTOLITHOGRAPHY discloses a process for creating a DRAM array having feature widths that transcend the resolution limit of the employed photolithographic process using only five photomasking steps. The process includes the following steps: creation of a half-pitch hard-material mask that is used to etch a series of equidistantly-spaced isolation trenches in a silicon substrate; filing the isolation trenches with insulative material; creation of a hard-material mask consisting of strips that are $1\frac{1}{2}$F. in width, separated by spaces that are $\frac{1}{2}$F in width, that is used to etch a matrix of storage trenches; angled implanatation of an N-type impurity in the storage trench walls; another anisotropic etch to deepen the storage trenches; deposition of a capacitor dielectric layer; deposition of a protective polysilicon layer on top of the dielectric layer; removal of the dielectric layer and the protective polysilicon layer at the bottom of each storage trench with a further anisotropic etch; filling the storage trenches with in situ-doped polysilicon and planarization down to the substrate level; creation of an access gate on opposite sides of each storage trench.

SUMMARY OF THE INVENTION

An object of the present invention is to provide a method for fabricating a DRAM trench capacitor with multiple pillars inside a trench for an increased surface area. The method disclosed is based upon lithographic masking and etching of poly and nitride layers. Consequently, a larger increase in the surface area of the capacitor is producible with the disclosed invention, which also provides a simpler process than the prior art.

A further object of the present invention is to provide a method of increasing the surface area of a trench capacitor where randomly placed multiple pillars are placed inside of a trench without using a lithographic mask.

BRIEF DESCRIPTION OF THE DRAWINGS

FIG. 9 is a representation of the stacked layers of

DETAILED DESCRIPTION

As the density of semiconductor memories such as DRAMs having trench storage capacitors increases, the need for increasing the capacitance per unit area becomes more acute. One known method proposed for stacked-capacitor DRAMs is using rough-surface polysilicon. This approximately doubles the surface area. Increasing the surface area by a factor of two is desirable, but it is not enough to achieve the desired densities without introducing more complicated three-dimensional structures.

Figure 1:
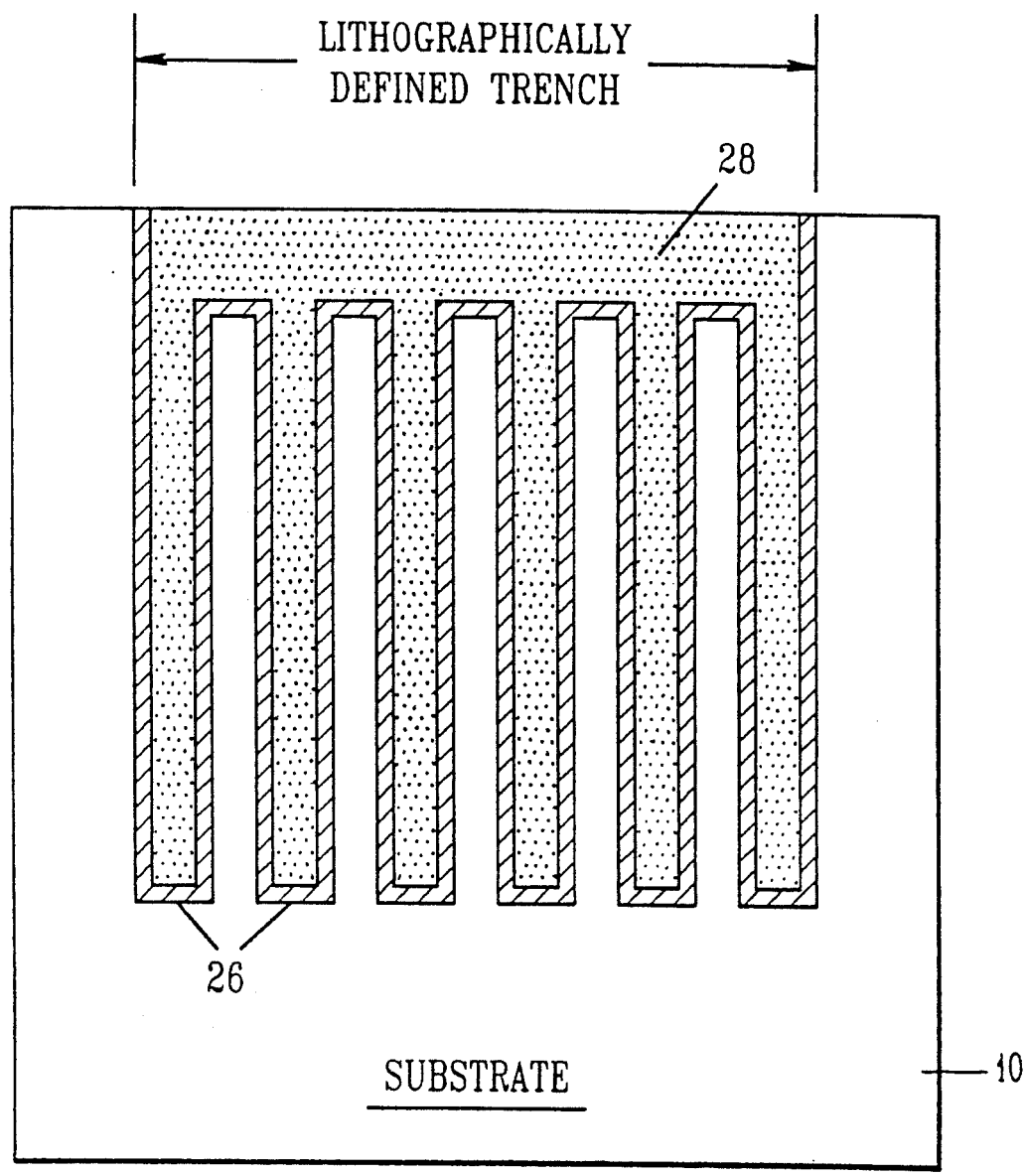
FIG. 1 illustrates randomly placed multiple pillars disposed inside of a trench.

A novel method of increasing the surface area of a trench capacitor according to the present invention is disclosed where randomly placed multiple pillars are placed inside of a trench without using a lithographic mask as shown in FIG. 1. The present invention uses a method referred to a TOpographic Feature Enhancement by RIE (TOFER). In TOFER, a thin layer of large-grain polysilicon is deposited on a nitride layer which is on top of polysilicon. The topographical features of the large-grain polysilicon are copied into the nitride by RIE first. Then, the features in the nitride are transferred into the polysilicon by RIE which has a selectivity in favor of polysilicon. During the transfer, the features in the nitride are enhanced in the vertical direction by a factor given by the selectivity.

The TOFER process can be potentially used either to increase the surface area of a stacked capacitor or as a mask to create multiple pillars inside of a trench. It utilizes the differences in Reactive-Ion Etch (RIE) rate of two different layers to enhance the topographical features of the first layer and to transfer the enhanced features to the second layer, resulting in larger height differences of the features in the second layer.

Figure 2A:
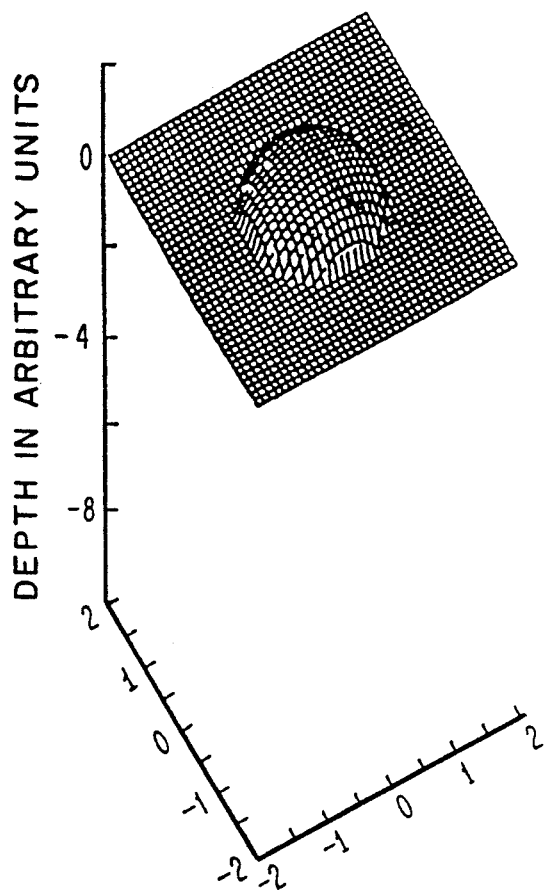
FIG. 2A is a representation of a bump material on a polysilicon layer before etching.
Figure 2B:
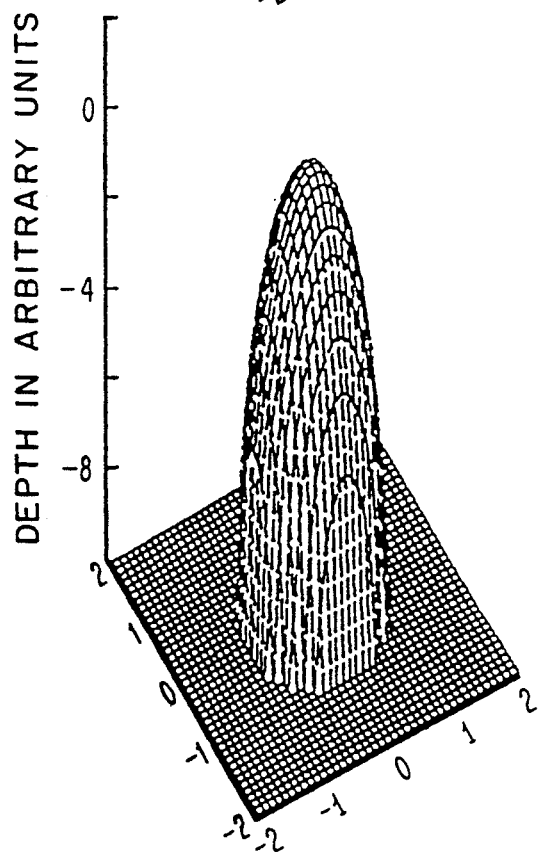
FIG. 2B is a representation of the material in FIG. 2A after etching.

The TOFER concept is further explained in FIGS. 2A, 2B, 3, and 4. As shown in FIG. 2A, it is assumed that there is a hemispherical bump of silicon nitride with a radius of 10 nm on top of a polysilicon layer. As it is RIE'ed in a preferential polysilicon etching gas mixture with a 10:1 selectivity to nitride, the thinner nitride near the edge of the bump is removed sooner than the center portion. Thus, the polysilicon under the edge is etched longer than its counter part in the center. The resulting shape is half spheroid with an increased surface area and higher height as shown in FIG. 2B.

Figure 3:
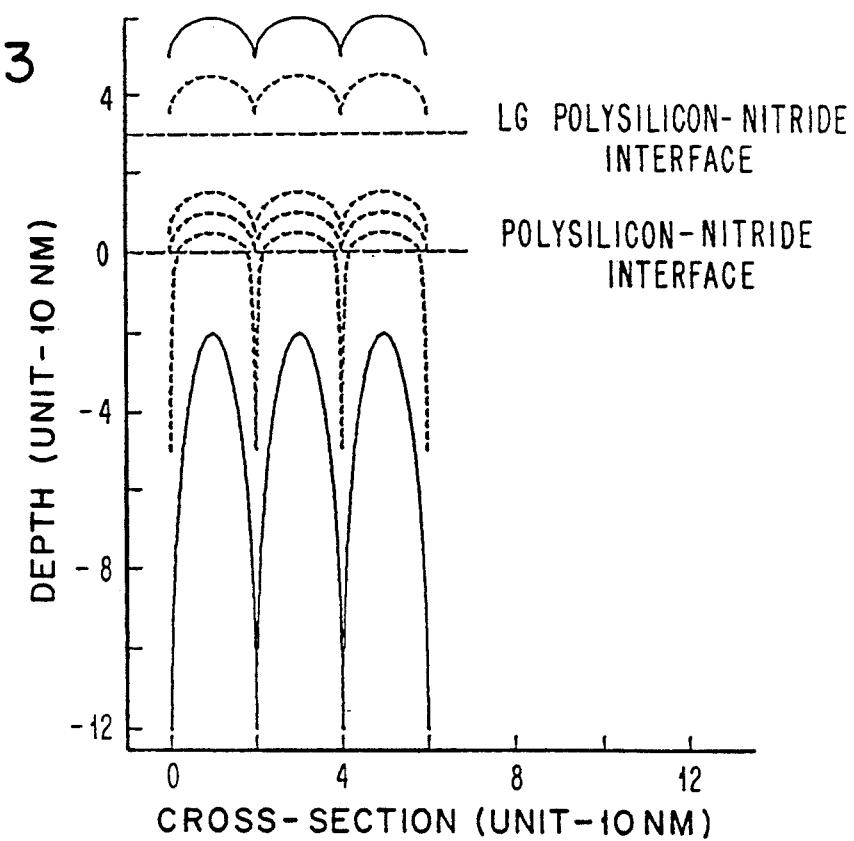
FIG. 3 is a representation of a simulated profile using the TOFER process.
Figure 4:
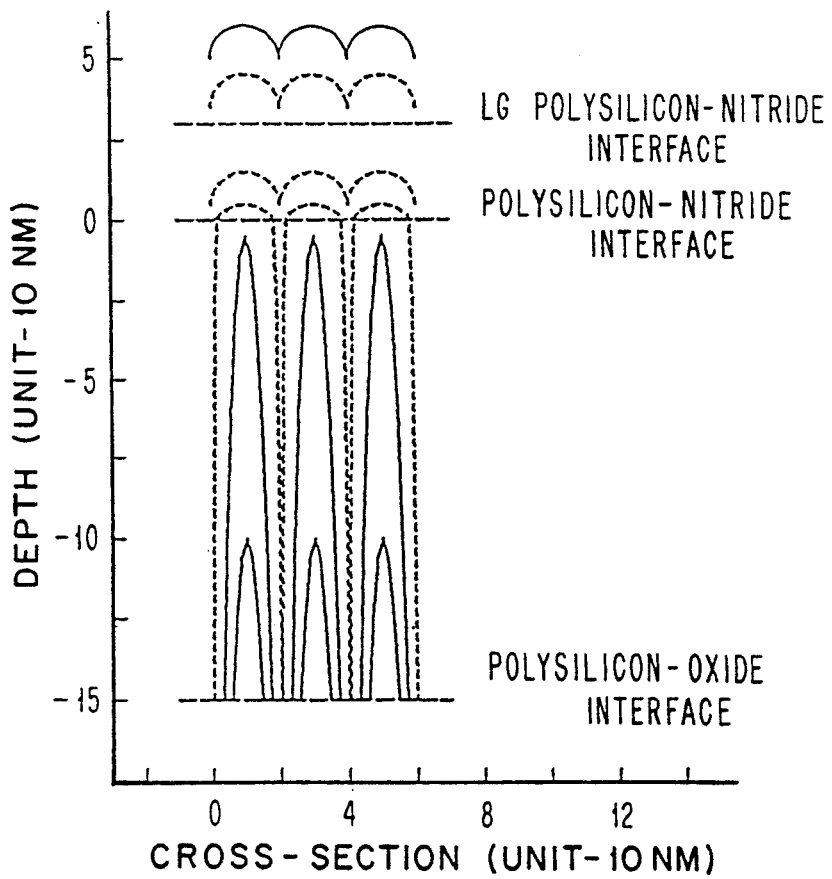
FIG. 4 is a representation of another simulated profile using the TOFER process.

FIGS. 3 and 4 show the simulated profiles of TOFER process. A 30-nm thick larger-grain polysilicon layer (bumpers are 10 nm in radius) is deposited on 30-nm thick silicon nitride layer, which is on top of a polysilicon layer. The profile is shown as the top-most solid-line curve in FIG. 3. The poly profile is transferred to the nitride layer by $CF_4$ (shown as the third curve from the top). The etching gas etches nitride and polysilicon at the approximately same rate. Now the etching gas is changed to a polysilicon etching gas, which is assumed to have a selectivity of 10:1 to nitride. Successive curves show the profiles during the etching. It is noted that the bumps in the polysilicon are all connected together. More detailed analysis from analytical geometry shows that the ratio of the surface area before and after is given by:

$$\frac{1 + \frac{R_{E2}}{\sqrt{R_{E2} - 1}} \sin^{-1}\left(\frac{\sqrt{R_{E2} - 1}}{R_E}\right)}{2}$$

where $R_E$ is the selectivity or the etch ratio. As an example, the above equation gives that the surface area will increase by a factor of 7.89 compared to the hemispherical surface (15.78 compared to the planar surface) when the etch ratio is 10. In FIG. 4, an oxide layer is placed under the polysilicon as an etch-stop layer. A higher selectivity of 50:1 to nitride is also assumed. The bottom two solid-line curves show the resulting polysilicon bumps. Note that the polysilicon bumps are separated from each other because of the oxide etch stop. Each of these separated polysilicon bumps could be used as a mask to etch the underlying oxide. The etched oxide could, in turn, be used to etch multiple pillars inside of a trench.

The method according to the present invention of fabricating the multiple-pillar trench shown in FIG. 1 is described below using FIGS. 5 through 10.

Figure 5:
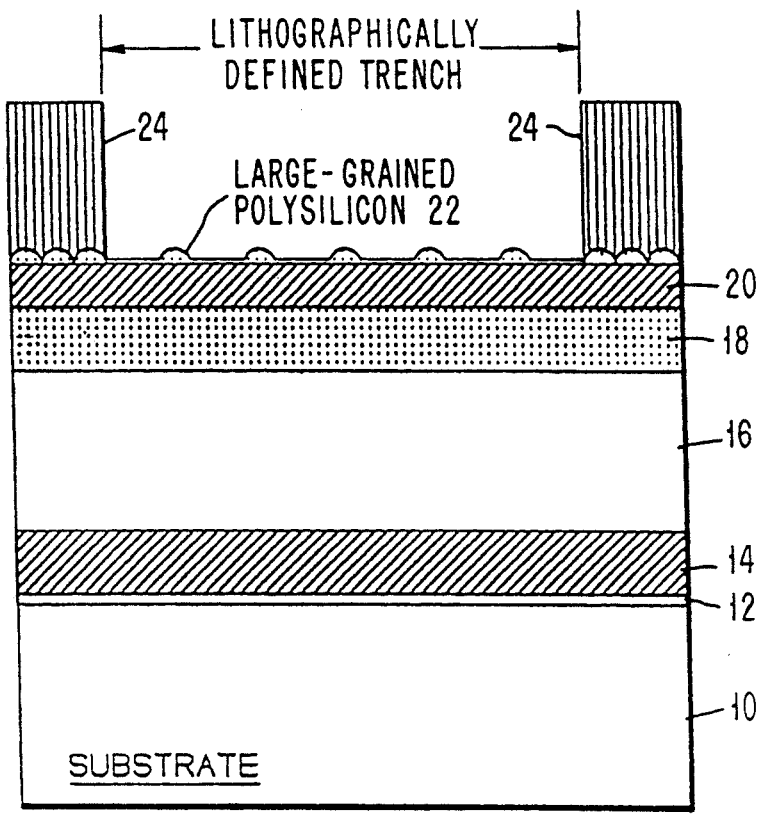
FIG. 5 is a representation of stacked layers of material prior to etching.

As shown in FIG. 5, on a silicon substrate 10, a thin pad oxide 12 of a few tens of nanometers is grown. A several tens of nanometer of silicon nitride 14 is deposited by CVD (chemical vapor deposition). Another layer of CVD oxide 16 is deposited. It is about a few hundred nanometers thick. This provides the ONO stack. Then, three layers needed for TOFER (Topographical feature enhancement by RIE) are deposited. They are a layer of 300 nm of polysilicon 18, a layer of 30 nm of nitride 20, and a layer of 20 to 30 nm of large-grained polysilicon 22 which are deposited sequentially as shown in FIG. 5. Then, the trench is defined by a lithographic mask 24.

Figure 6:
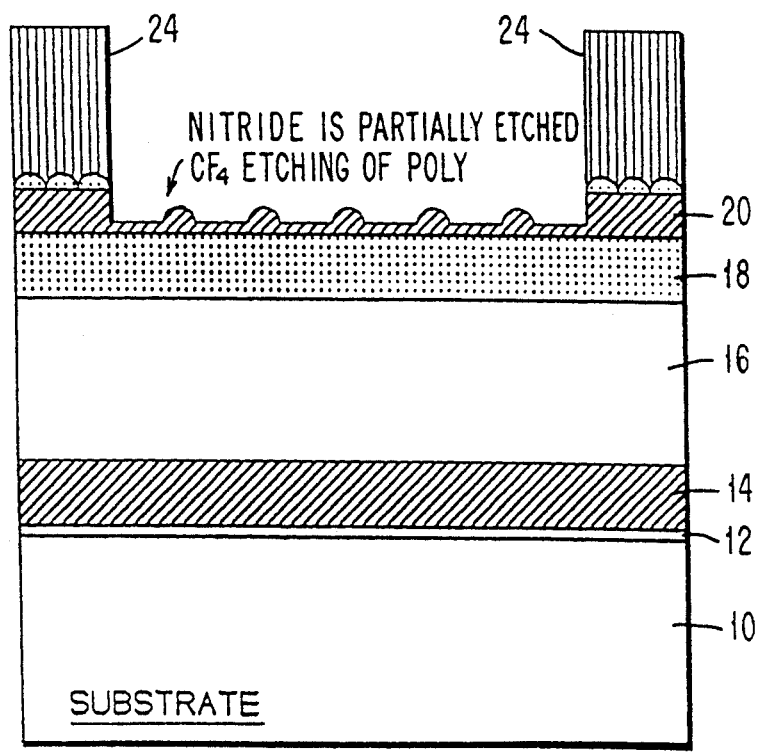
FIG. 6 is a representation of the stacked layers of material in FIG. 5 after the large-grained polysilicon is etched.

The exposed large-grained polysilicon is RIEed in $CF_4$ as shown in FIG. 6. Since $CF_4$ etches the polysilicon 22 and nitride 20 at almost the same rates, the topographical features existed in the polysilicon layer 22 of FIG. 5 is copied to the nitride layer 20 of FIG. 6. The nitride layer 20 is partially etched.

Figure 7:
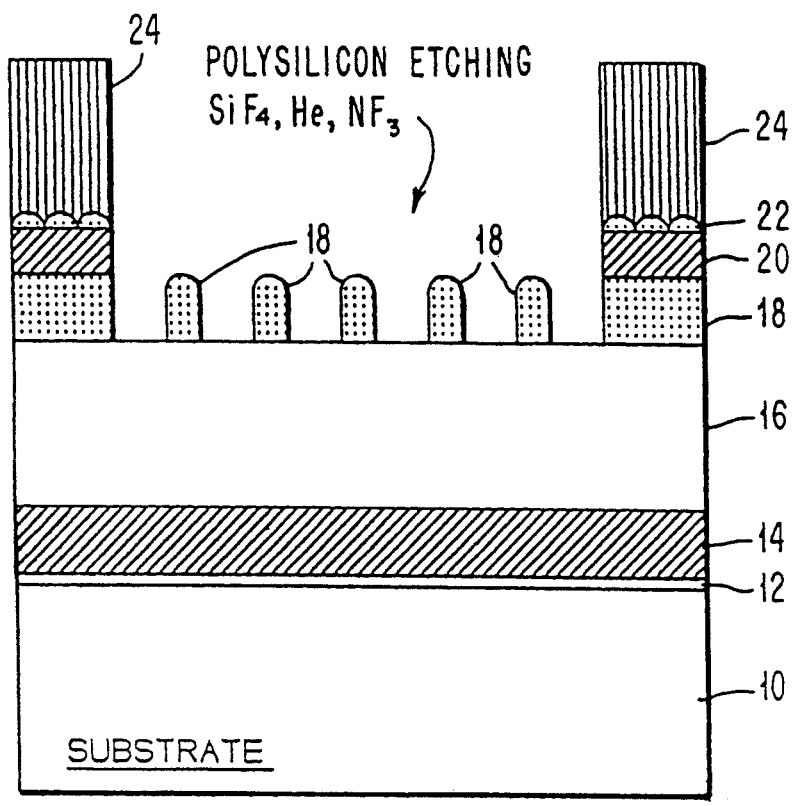
FIG. 7 is a representation of the stacked layers of material in FIG. 6 after being directionally etched.

The RIE etching gas is then changed to a mixture of HBR, $SiF_4$, Helium, and $NF_3$ as shown in FIG. 7. The gas mixture gives a very directional polysilicon etching with a good selectivity to nitride and a very high selectivity to oxide. (This mixture etches polysilicon faster than the nitride and does not etch oxide much.) Consequently, the topographical features on the nitride layer 20 of FIG. 6 is enhanced and is transferred to the polysilicon layer 18 of FIG. 7. Minimal etching of the underlying oxide layer 16 happens because of the high selectivity of the etching gas.

Figure 8:
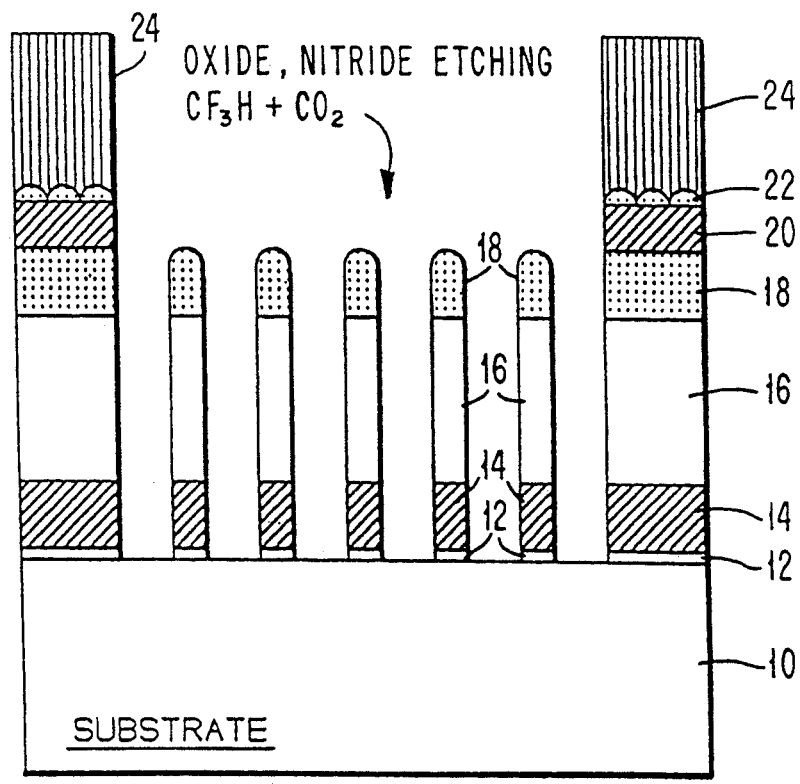
FIG. 8 is a representation of the stacked layers of material in FIG. 7 after additional etching.

Using the polysilicon material left from layer 18 as a mask, the CVD oxide 16, nitride 14, pad oxide 12 are sequentially etched in a mixture of $CF_3H$ and $CO_2$ as shown in FIG. 8. This etches nitride and oxide with a good selectivity to polysilicon and silicon substrate. No undercutting of the substrate will result.

Figure 9:
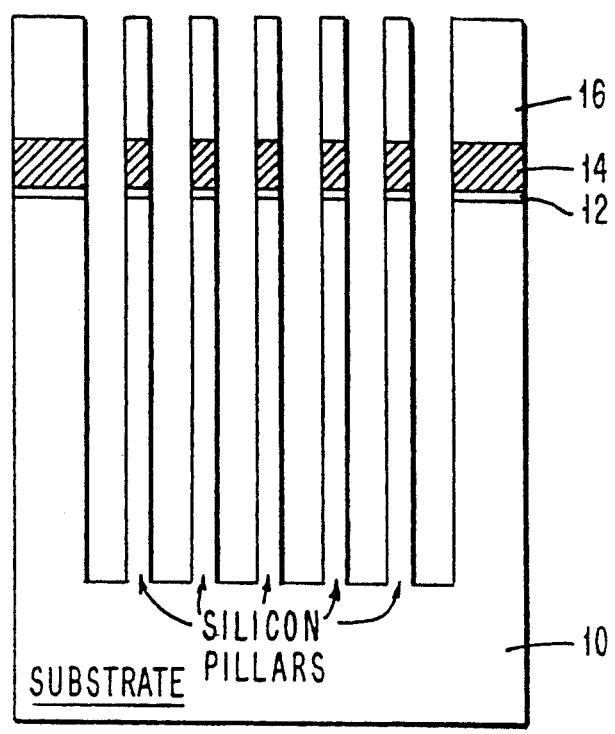

Next, the lithographic mask 24 is removed and the silicon substrate 10 is etched in the same mixture used in FIG. 7. The portion of the three layers 18, 20 and 22 used for TOFER masked during the previous steps is now exposed and is removed leaving behind only the CVD oxide layer 16. After the substrate etching, the structure is shown in FIG. 9.

Figure 10:
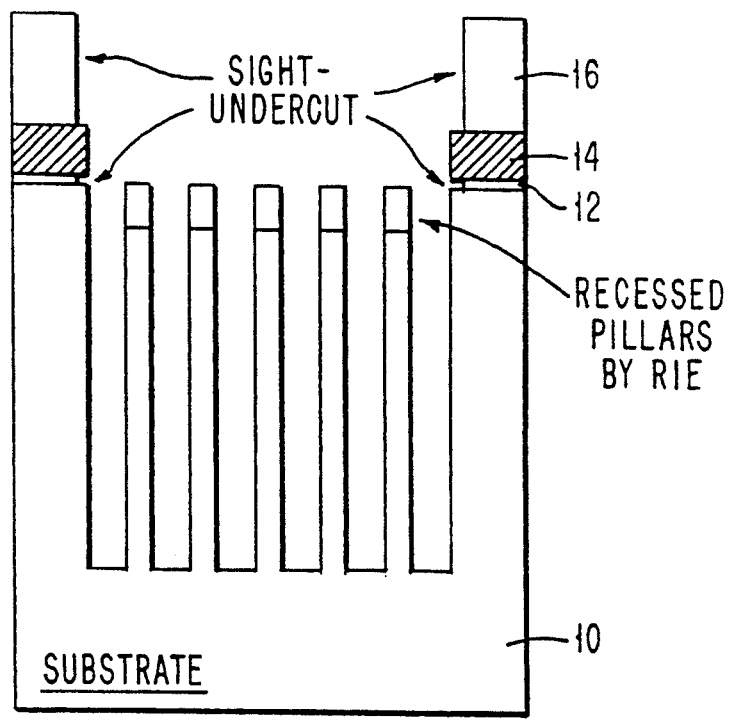
FIG. 10 is a representation of the stacked layers of material in FIG. 9 after still further etching.

Now referring to FIG. 10, the CVD oxide 16, nitride 14, and pad oxide 12 on top of the silicon pillar are removed by wet etching the pad oxide in a buffer HF. Since the widths of the pillar are a lot smaller than the trench dimensions, only the layers on top of the pillars are removed, leaving behind the regions covered by the original lithographic mask very slightly touched. Slight undercutting of the pad oxide 12 will result but it is acceptable because the wet etching is just long enough to remove the pad oxide under the pillars.

The pillars are then recessed below the silicon substrate level using silicon-etching RIE used in the previous steps. The recessed pillars are also shown in FIG. 10.

To complete the structure as shown in FIG. 1, the CVD oxide 16 is removed in BHF or RIE. Oxide-nitride-oxide (ONO) layer 26 is grown and deposited as capacitor interdielectric. Polysilicon 28 is deposited and chemical-mechanically polished using the nitride layer as stopping layer.

For DRAM applications, the conventional CMOS DRAM process steps can proceed as usual.

What has been described is a method for increasing the capacitor surface area for a DRAM trench capacitor the inventor provides the following advantages.

Multiple pillars are created inside of a lithographically defined trench to increase its capacitance by topographical feature enhancement by RIE (TOFER). No additional lighographical mask is needed. The process is simpler than prior art processes because it does not require a very long wet etching of the oxide spacers used to form the pillar. Only one polysilicon fill is needed. Only one etching of the silicon substrate is needed. The mechanical stability of the multiple pillars is better because they are of a single crystal. Also, the capacitor interdielectric metal is grown in a single crystal in the multiple pillar trenches. In the prior art, the dielectric is grown on the single crystal as well polysilicon pillar, resulting in uneven thickness.

Having thus described our invention, what we claim as new, and desire to secure by Letters Patent is:

1. A method of fabricating semiconductor memory devices with trench capacitors having increased surface areas comprising the steps of:
   step 1) forming a first plurality of stacked layers of material on a substrate surface;
   step 2) forming a second plurality of stacked layers of material on said first plurality of stacked layers wherein the uppermost layer of said second plurality of layers has an irregular surface;
   step 3) etching a selected region of said uppermost layer of said second plurality of stacked layers and partially etching said next to uppermost layer of said second plurality of stacked layers to form a trench wherein the irregular surface of said uppermost layer is replicated in the etched surface of said partially etched next to uppermost layer;
   step 4) directionally etching said next to uppermost layer with a selective etchant that etches said uppermost layer faster than said next to uppermost layer to remove said next to uppermost layer and form spaced pillars of polysilicon from said first uppermost layer;
   step 5) using said spaced pillars of said uppermost layer as a mask, etching said second plurality of stacked layers to form pillars on the surface of said substrate within said trench composed of layers of said first and second plurality of said stacked layers.

2. A method fabricating semiconductor memory devices according to claim 1 further including the additional steps;

step 6) etching said substrate material between said pillars to extend and recess said pillars into said trench in said substrate, and etching said remaining layers of said second plurality of stacked layers between said pillars;

step 7) etching away said remaining layers of said first plurality of stacked layers from said pillars.

3. A method of fabricating semiconductor memory devices according to claim 1 wherein said step 1) of forming a first plurality of stacked layers includes step 1A) forming a first layer of oxide on a substrate;

step 1B) depositing a first layer of nitride on said first oxide layer;

step 1C) forming a second layer of oxide on said nitride layer wherein said step 2) of forming said second plurality of stacked layers includes step 2A) depositing a first layer of polysilicon on said second oxide layer;

step 2B) depositing a second layer of nitride on said polysilicon layer;

step 2C) depositing a layer of large-grained polysilicon on said second nitride layer;

and wherein said steps 3, 4 and 5 include step 3) etching a selected region of said layer of large-grained polysilicon and partially etching said second layer of nitride therebelow to form a trench wherein the surface of said large-grained polysilicon layer is replicated in the etched surface of said partially etched second nitride layer;

step 4) directionally etching said second nitride layer with a selective etchant that etches polysilicon faster than nitride to remove said second nitride layer and form space pillars of polysilicon from said first polysilicon layer;

step 5) using said spaced pillars of polysilicon as a mask, etching said second oxide layer, said first nitride layer and said first oxide layer to form oxide-nitride-oxide-polysilicon pillars on the surface of said substrate with said trench.

4. A method of fabricating semiconductor memory devices according to claim 3 further including the additional steps;

step 6) etching said substrate material between said pillars to extend and recess said pillars into said trench in said substrate, and etching said remaining layers of large-grained polysilicon, said second layer of nitride and said first polysilicon layer between said pillars;

step 7) etching away said remaining second oxide layer, said first nitride layer and said first oxide layer from the layers of said pillars.

5. A method of fabricating semiconductor memory devices according to claim 1 wherein said substrate is composed of silicon and said first layer of oxide formed in step 1 is silicon oxide;

said nitride layer formed in step 2 is silicon nitride;

said second layer of oxide formed in step 3 is silicon oxide.

6. A method of fabricating semiconductor memory devices according to claim 3 wherein said large-grained polysilicon layer etched in step 7 is reactive-ion-etched using $CF_4$ which etches said large-grained polysilicon layer and said second nitride layer at almost the same rate;

said second nitride layer is etched in step 7 with a mixture of HBR, $SiF_4$ Helium and $NF_3$ which etches polysilicon faster than nitride said second oxide layer, said first nitride layer and said first oxide layer are etched in step 9 using a wet etch in a buffer HF;

and wherein said etching in step 10 uses silicon-etching reactive ion-etching.

* * * * *